US008555237B1

(12) United States Patent
Juneja et al.

(10) Patent No.: US 8,555,237 B1
(45) Date of Patent: Oct. 8, 2013

(54) METHOD AND APPARATUS FOR DESIGN RULE VIOLATION REPORTING AND VISUALIZATION

(75) Inventors: Pardeep Juneja, Keshav Puram (IN); Om Kanwar, Faridabad (IN); Harindranath Parameswaran, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/542,424

(22) Filed: Jul. 5, 2012

(51) Int. Cl.
*G06F 17/50* (2006.01)

(52) U.S. Cl.
USPC ............. 716/139; 716/52; 716/111; 716/112; 716/136

(58) Field of Classification Search
USPC .............................. 716/52, 111–112, 136, 139
See application file for complete search history.

(56) References Cited

U.S. PATENT DOCUMENTS

| | | | |
|---|---|---|---|
| 5,675,499 A * | 10/1997 | Lee et al. .................. | 324/755.01 |
| 6,448,977 B1 | 9/2002 | Braun et al. | |
| 6,480,995 B1 | 11/2002 | Schmidt et al. | |
| 6,791,548 B2 | 9/2004 | Dutta et al. | |
| 6,882,892 B2 * | 4/2005 | Farrah et al. ..................... | 700/97 |
| 7,178,114 B2 | 2/2007 | Lin et al. | |
| 7,320,115 B2 * | 1/2008 | Kuo ................................ | 716/52 |
| 7,441,220 B2 | 10/2008 | Hetzel et al. | |
| 7,865,012 B2 * | 1/2011 | Majima et al. ................ | 382/149 |
| 7,921,390 B2 | 4/2011 | Archambeault et al. | |
| 8,296,706 B2 * | 10/2012 | Gray et al. ..................... | 716/122 |
| 2005/0229134 A1 | 10/2005 | Hetzel et al. | |
| 2008/0320418 A1 * | 12/2008 | Huang et al. ................... | 715/840 |
| 2009/0007033 A1 * | 1/2009 | Suri ................................. | 716/4 |
| 2010/0235796 A1 * | 9/2010 | Koizumi et al. .................. | 716/5 |
| 2010/0332172 A1 * | 12/2010 | Kaufman et al. .............. | 702/81 |
| 2011/0265055 A1 * | 10/2011 | Gray et al. ..................... | 716/119 |

OTHER PUBLICATIONS

Martin, "Tutorial Cadence Design Environment", New Mexico State University, Oct. 2000, pp. 1-51.

\* cited by examiner

*Primary Examiner* — Naum Levin
(74) *Attorney, Agent, or Firm* — Kenyon & Kenyon LLP

(57) ABSTRACT

An apparatus and method for reporting design rule violations of an integrated circuit design includes collecting data from a design rule checker module, processing the data, and displaying design rule violations onto the layout. The display of the design rule violations may be interactive by including hypertext links to specifications, text bubbles with violation explanations, measurements, highlighting areas of the layout corresponding to a particular rule, and providing hierarchically expandable nodes for constraint violations in a browser.

20 Claims, 10 Drawing Sheets

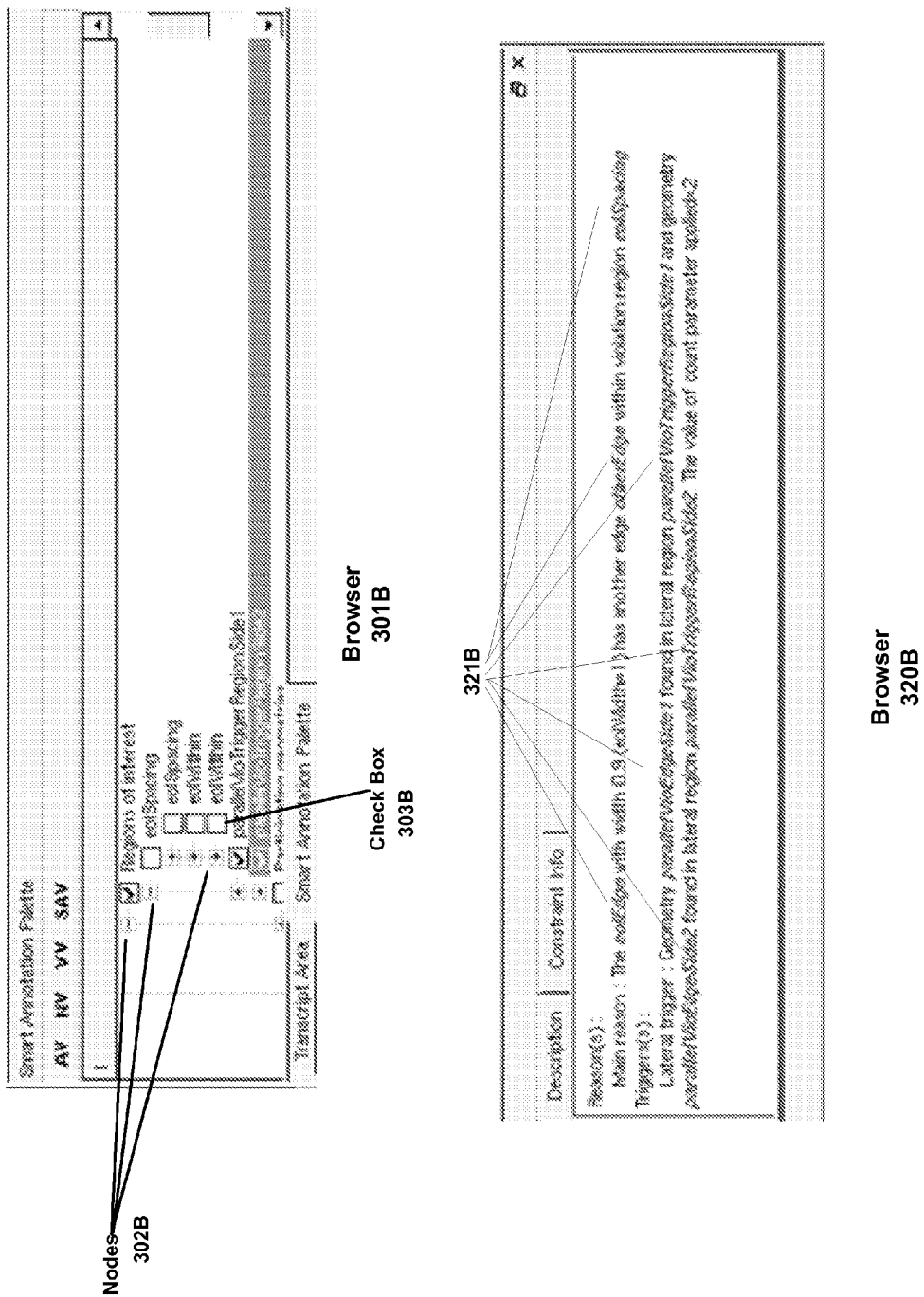

METHOD AND APPARATUS FOR DESIGN RULE VIOLATION REPORTING AND VISUALIZATION

BACKGROUND

The physical layout of a VLSI design has to adhere to certain design constraints which may be dictated mostly by the technology used to fabricate the design to ensure manufacturability. As the industry has moved towards denser chips with smaller features and nodes, the number of constraints and the attendant complexities have increased. For example, there are more than a thousand such constraints that may be applicable to a design for the current 20 nm regime. With this increase, there is a need for a comprehensive display of design rule violations within a layout such that designers can efficiently understand and solve the violations.

BRIEF SUMMARY OF THE INVENTION

In one aspect, the present invention is directed to an apparatus and method for providing rules for constraint violations through interactive textual and visual representations. According to this aspect, the invention may include apparatus and functionality which include identifying design rule violations on a design layout, converting information about the violations into objects having a Constraint Independent Model data structure, and using the objects to display the design rule violations on a design layout.

BRIEF DESCRIPTION OF THE DRAWINGS

FIG. 3B is a magnified view of one portion of the Violation Visualizer of FIG. 3A.

DETAILED DESCRIPTION

As will be described hereinafter in greater detail, one aspect of the present invention relates to a method of extracting raw data from a Design Rule Checker (DRC) module, processing the raw data, and displaying the data in an easily ascertainable manner. In this regard, the following description is presented to enable any person skilled in the art to make and use the invention. For purposes of explanation, specific nomenclature is set forth to provide a thorough understanding of the present invention. Description of specific applications and methods are provided only as examples. Various modifications to the preferred embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

Figure 1:
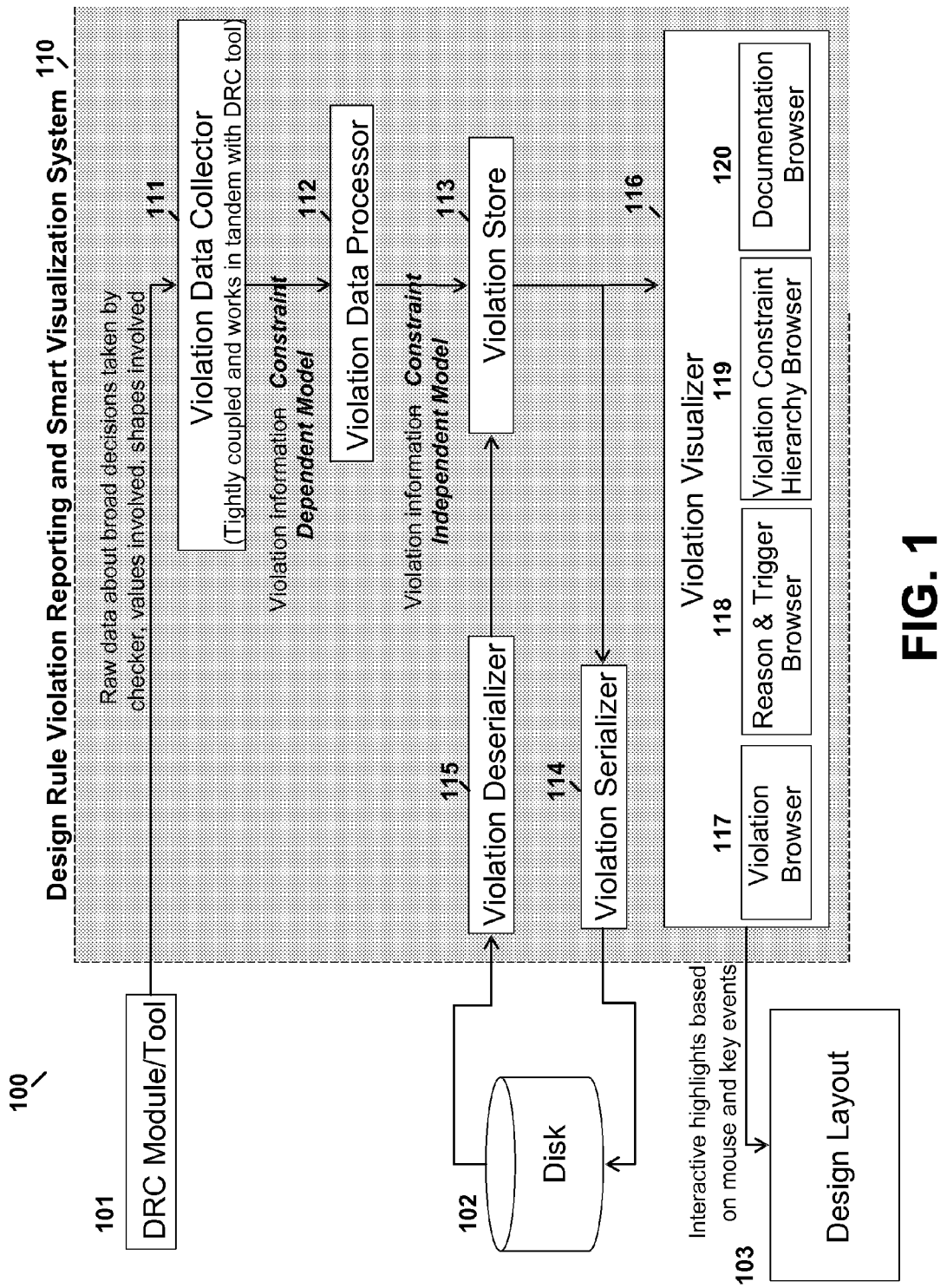
FIG. 1 is a block diagram illustrating the components of a design rule violation reporting system in accordance with one aspect of the present invention.

Referring now to the drawings, and more particularly to FIG. 1, DRC module 101 is a design rule checker that checks for and identifies violations of design rules in a design layout. Several examples of design rule checkers include but are not limited to Calibre, Hercules, PVS/DRD, Quartz, fiXtress, AUNT, HiPer Verify, Gaurdian DRC, Advanced Design System Design Rule Checker, VERI, iDRC, etc. The invention is not limited to a particular design rule checker or type of design rule checker used. The DRC module 101 uses multiple values and geometric objects in a design layout to determine whether there has been a violation corresponding to a particular type of constraint. The module uses a Constraint Dependent Model ("CDM") data structure to encapsulate raw information about the determinations that the design rule checker makes, and the values and geometric shapes on which the design rule checker works while detecting the violation. Constraints are manufacturer-specific, and each constraint will have a CDM data structure. Accordingly, constraints will have constraint-specific naming conventions, manufacturer-defined formats, and constraint-defined fields containing a varied number of parameters, parameter types and values.

Within design rule violation reporting system 110, violation data collector 111 is a module, tightly coupled with the DRC module 101, that collects raw data about broad decisions taken by the DRC module when it checks for design rule violations. The violation data collector 111 also may collect data on various initial, transient, or final values of measurements and shapes from the DRC module 101. These values and shapes may include, but are not limited to, constraint values, values used to determine a violation, values of various parameters, feature shapes, transient shapes, shapes derived from existing shapes using certain geometric operations, etc. In this mode of operation, it is contemplated that the violation data collector 111 would only collect raw data and throw off any incomplete collections of data with respect to a violation as soon as the DRC module 101 finishes working on the potential violation. As a result, the runtime and memory requirements of the DRC module would not tangibly increase when the violation data collector 111 is run in tandem with the DRC module 101. As noted earlier, the data that DRC module passes to violation data collector 111 has a CDM structure.

A violation data processor 112 then processes the collected data from the violation data collector 111, converting the data structure from a CDM structure to a Constraint Independent Model ("CIM") structure. The CIM represents all the possible constraints and violations in a unified manner rather than representations that are unique to each particular constraint The following is one example of a CDM structure and how it is converted to a CIM structure. A semiconductor manufacturer provides a constraint specification which details the attributes of the constraint's rules. For example, all manufacturers have a restriction for spacing between shapes on a layer when there is a dense configuration of neighboring shapes in the same layers. A particularly complex version of this constraint relates to spacing between an end of a line to other shapes. Assuming the name minEndOfLineSpacing for this constraint, an instantiation of this constraint specification may appear as follows:

| Value/Parameter | Name | Unit | Optional | Description |
|---|---|---|---|---|
| Value | eolSpace | Microns | No | Required minimum distance from an "End of line" edge of a shape to any edge of any other shape. |
| Parameter | Width | Microns | No | Minimum length of an edge of a shape to be qualified as an "end of line". |
| Parameter | Distance | Microns | Yes | Lateral verification distance. If this parameter is specified, then the constraint will apply only if there is a shape found within 'distance' microns to the sides of the "end of line" being checked. |
| Parameter | endToEndSpacing | Microns | Yes | If the other edge is also an 'end of line', then the spacing must be endToEndSpacing instead of the constraint value. |

In this example, this specification would formulate any minEndOfLineSpacing rule. Here, the minEndOfLineSpacing specification dictates that a minEndOfLineSpacing rule has up to 4 attributes (in reality, this constraint has more than 30 such attributes). The names of the four attributes given here are described under the Name heading.

Under the Value/Parameter heading, each attribute is designated as a value or a parameter. A value is an attribute that establishes the violation of the constraint. A parameter, on the other hand, is an attribute that determines whether the value will apply in any given situation or whether the value itself is changed. For example, the Distance parameter in the above example, if enabled, would trigger the application of the Value parameter, while the endToEndSpacing parameter, if triggered, changes the minimum distance from the eolSpace to the endToEndSpacing.

This minEndOfLineSpacing specification also dictates that the measurement units are to be in Microns under the Units heading. Additionally, this specification has a section on whether a rule is required to use a particular attribute. In this case, the eolSpace and Width are mandatory attributes for the minEndOfLineSpacing, while Distance and endToEndSpacing are optional. Under the "Description" heading a description of each particular attribute is provided. In this example, a rule with an eolSpace value of 0.1 would require that the distance from an "End of line" edge of a shape to any edge of any other shape be 0.1 microns or greater.

The following are two rules based on the minEndOfLineSpacing specification:

| Rule 1 | |
|---|---|
| Value/Param | Value |
| Value (eolSpace) | 0.1 Micron |
| Width | 0.05 Micron |
| Distance | 0.2 Micron |

| Rule 2 | |
|---|---|
| Value/Param | Value |
| Value (eolSpace) | 0.15 Micron |
| Width | 0.05 Micron |
| endToEndSpacing | 0.02 Micron |

One of ordinary skill in the art reading the minEndOfLineSpacing specification in conjunction with Rule 1 would understand that Rule 1 requires (1) that a shape must be at least 0.1 micron away from an end of line edge of another shape if (2) the minimum length of the other shape's edge is at least 0.05 microns long and (3) there is a shape within 0.2 microns of the sides of the other shape.

Rule 1 and 2 illustrate optional aspects of the minEndOfLineSpacing specification. Rule 1 does not have a value for endToEndSpacing, which is an optional attribute for the minEndOfLineSpacing rule (as seen in its specification under the "Optional" heading), but does have the Distance attribute, which also is optional. Rule 2, on the other hand, does not list the optional Distance attribute and does use the optional endToEndSpacing attribute.

Looking back at FIG. 1, DRC module 101 uses these rules to detect constraint violations in a layout and puts information about the violations into a Constraint Dependent Model data structure. As explained earlier, CDM data structures will differ from one constraint to another. The information stored in a CDM data structure will generally contain the name of the constraint violated; the group of constraints to which the particular constraint belongs (also known as a parent constraint group); the value of the constraint, which may be in a table format; values of the parameters, which also may be in a table format; information on whether a parameter was used; a set of geometric objects with naming conventions specific to the constraint; a set of boolean values representing various decisions taken by the checker while checking for violations; and a set of measurements values or any other values used by the DRC when generating the violation. Different CDM data structures may contain differing amounts of information. As an example one embodiment of a CDM data structure for the reduced minEndOfLineSpacing violation is shown below.

| Attribute Name | Attribute Description |
|---|---|
| constraintHandle | Handle/Pointer to the constraint that was applied. |
| wasEndToEndSpacingUsed | Boolean value signifying if the endToEndSpacing value was used in this violation or not. |
| endOfLineShape | Geometric shape object representing the end of line edge which caused violation. |

-continued

| Attribute Name | Attribute Description |
|---|---|
| otherEdge | Geometric shape object representing the other edge which was found to be within eolSpace or endToEndSpace microns of the end of line edge. Which out of the two values eolSpace and endToEndSpacing was used is decided by whether the value wasEndToEndSpacingUsed is true or false |
| listOfLateralShapes | List of geometric shape objects found in the lateral region within 'distance' microns from the end-of-line edge |

The fields under the title Attribute Name are determined by the constraint to which the title applies. The DRC module 101 fills in the fields under the Attribute Description. In the above example the fields under Attribute Description contain a description of what a DRC module 101 would be expected to enter into those fields. Violation 1 (below) is an example of a CDM object of a violation of Rule 1 with the CDM data structure for the minEndOfLineSpacing.

Violation 1

| Attribute | Attribute Value |
|---|---|
| constraintHandle | Pointer to Rule 1 |
| wasEndToEndSpacingUsed | False |
| endOfLineShape | The shape object derived from the end of line edge |
| otherEdge | The shape object derived from the other edge |
| listOfLateralShapes | List of all shapes that were found within 'distance' lateral distance. |

The value in the field next to constraintHandle is a pointer to Rule 1 because Rule 1 was violated. Since Rule 1 does not use the EndToEndSpacing attribute, the value in the field next to wasEndToEndSpacingUsed is "false". The value in the field next to endOfLineShape is normally the information identifying the geometric shape or object the DRC tool qualified to satisfy the Width parameter in the rule. The value in the field next to otherEdge would be information identifying the geometric shape that is within the eolSpace creating the eolSpace violation, not the geometric shape identified as the endOfLineShape. The value in the listOfLateralShapes field would be information identifying all the shapes satisfying the Distance parameter of the minEndOfLineSpacing rule.

The following two violation objects are examples of violations stored in the minEndOfLineSpacing CDM data structure when Rule 2 is violated.

Violation 2

| Attribute | Attribute Value |
|---|---|
| constraintHandle | Pointer to Rule 2 |
| wasEndToEndSpacingUsed | False |
| endOfLineShape | The shape object derived from end of line edge |
| otherEdge | The shape object derived from the other edge |
| listOfLateralShapes | Empty list, as rule 2 does not have a 'distance' parameter. |

Violation 3

| Attribute | Attribute Value |
|---|---|
| constraintHandle | Pointer to Rule 2 |
| wasEndToEndSpacingUsed | True |
| endOfLineShape | The shape object derived from the end of line edge |
| otherEdge | The shape object derived from the other end of line edge |
| listOfLateralShapes | Empty list, as rule 2 does not have a 'distance' parameter. |

In one embodiment, a violation data processor 112 converts the data in a CDM structure into a CIM structure. The violation data processor would be aware of semantics of the constraints so as to be able to map the data in the CDM structure into the CIM structure.

A CIM would use few or no semantics of the constraints, so that other applications could use the information without being aware of the semantics of every constraint. In one embodiment, the constraint information is structured according to Participating Geometries, Reasons of Interest, Violation Region, Reasons, Triggers, and Constraint info. One possible example of this CIM data structure format is shown below.

| | |
|---|---|
| Participating Geometries list | |
| Regions of Interest list | |
| Violation Region | |
| Reasons list | |
| Triggers list | |
| ConstraintInfo | |

These are generic terms to categorize violation information or data without the semantics of the constraint rule. In this example, Participating Geometries may include any geometry between which a constraint is violated. Regions of Interest may include the shapes that caused the application of the constraint to participating geometries or bounded areas. The participating geometries or bounded areas are the geometries and areas of interest in the applicability of the constraint. For Rule 1 (above), the Regions of Interest would be (1) the lateral area within 0.2 microns to the sides of the "end of line" edge to the edge of the shape that led to the application of the constraint and (2) the lateral side of the shape which led to application of the constraint. The Violation Region is the area bounding all Participating Geometries and Regions of Interest. Reasons are reasons why a violation occurred. Triggers describe why the constraint is being applied in this situation. An example of a Rule 1 minEndOfLineSpacing violation Reason may appear as follows:
Another end of line edge PG1 (reference to Participating Geometry 1) was within 0.1 Microns (Value/eolSpace) from the end of line edge of PG2 (Reference to Participating Geometry 2) having width=0.05 Microns (Width)
And a Trigger may appear as follows:
A lateral shape PG3 (reference to Participating Geometry 3) is within 0.2 microns (Distance) of PG2 (Geometry 1)
Though the reason and trigger above may appear to be similar in format, it should be noted that the reason is the cause of the Rule 1 violation, while the Trigger is why the Rule 1 applies.

Finally, the ConstraintInfo would be an object of the constraint found in the CDM. For the endOfLineSpacing CDM, this example would be the field next to constraintHandle.

Figure 2:
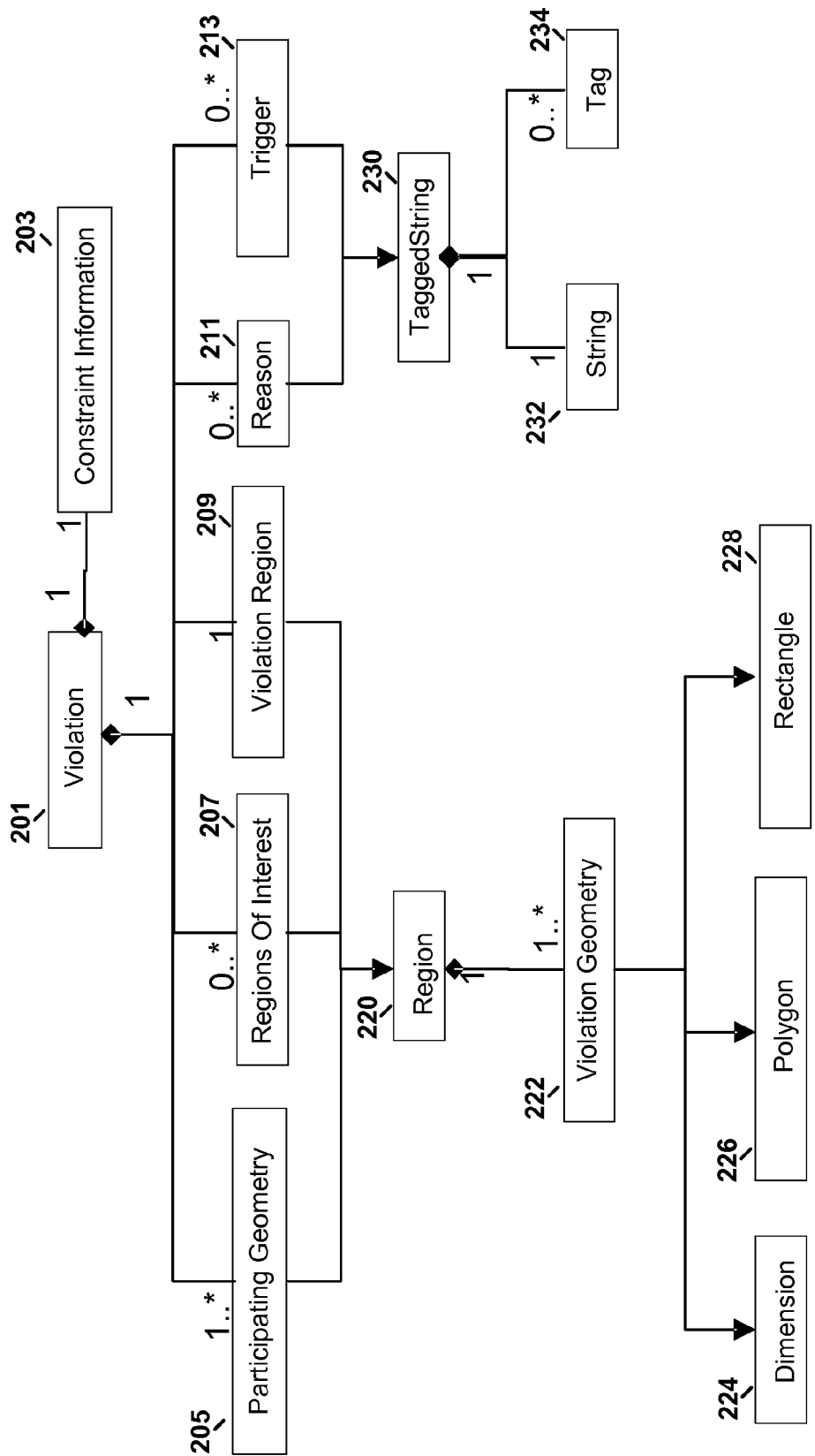
FIG. 2 is a class diagram for a Constraint Independent Model in accordance with one aspect of the present invention.

FIG. 2 is a class diagram for one embodiment of the CIM data structure. In this case, each violation 201 may be composed of constraint Information 203, one or more participating geometries 205, zero or more regions of interest 207, a violation region 209, zero or more reasons 211, and zero or more triggers 213. These are also the categories in the CIM data structure shown in the table above.

The participating geometries 205, regions of interest 207, and violation regions 209 are all types of a region 220, while reasons 211 and triggers 213 are types of a TaggedString 230. Each region 220 may be composed of one or more violation geometries 222 which in turn may include or be composed of a dimension 224, a polygon 226, or a rectangle 228. In one embodiment, a dimension 224 may include measured edges or distances. A polygon 226 may include information on every shape used to determine a constraint violation. A rectangle 228 may be a rectangular area representing the area that is used to determine a violation or a trigger for a violation.

A TaggedString 230 may be composed of one string 232 and zero or more tags 234. Strings 232 may be a normal string of characters. A string 232 may have a tag, and as such would be a string encoded to reference a region 220 or a violation geometry 222. An example of this is shown in the reason and trigger example above.

The violation data processor 112, which understands the semantics of all the constraints, takes a CDM object (one instance of a violation in a CDM data structure) and processes the information into a CIM object in accordance with the class diagram of FIG. 2. The following is an example of the CDM object of Violation 3 above, which is a violation of Rule 2, converted into the example-CIM object described herein:

| | | |
|---|---|---|
| Participating geometries list | 1. | PG1, (Region representing the end of line edge that caused the violation.) Name: "eolEdge", Text: "Width = (width of this edge) |
| | 2. | PG2, (Region representing the other end of line edge that was found within endToEndSpacing/eolSpacing distance of PG1.) Text: "otherEolEdge", Text: "Width = <width of this edge>" |
| Regions of interest list | 1. | RI1, (Region extending orthogonally from the end of line edge that caused the violation till the endToEndSpacing distance. This represents the rectangular region out of which the other end of line edge must be moved to fix the violation.) Name: "endToEndSpacing", Text: "0.2 Microns" |
| Violation region | 1. | VR, (Rectangular region which is bounding box of all participating geometries and regions of interest in this case.) |
| | 2. | Name: "Violation Region", Text: None |
| Reasons list | 1. | R1, "Another end of line edge <Reference to PG2> with width = <width of PG2> was found within endToEndSpacing (<endToEndSpacing value Microns>) from the end of line edge <Reference to PG1> having width = <width of PG1>" |
| Triggers list | | (this field would be left empty because the Distance parameter is not used in Rule 2) |
| ConstraintInfo | 1. | C1, (Reference to the constraint object found in corresponding CDM object.) |

A person of ordinary skill in the art would recognize that there can be multiple ways to go from a CDM structure to a CIM structure. This aspect of the invention does not depend on the particular method used. One of ordinary skill in the art would also recognize that, while the above mentioned constraints are relatively simple examples, these teachings would be applicable to other more complicated constraints with various, possibly different, attributes.

Looking back at FIG. 1, once the violation data processor 112 converts the data from a CDM structure to a CIM structure, the violation data processor 112 sends violation information as CIM objects to violation store 113, which stores the data. The violation store 113 serves as an intermediate store for violations represented in the CIM structure. Here, violation data can be received either from the violation data processor 112 or from applications outside the system through Deserializer 115. One example of an application outside the system would be a network disk.

Violation serializer 114 and violation deserializer 115 provide an application interface for other systems or devices. Violation serializer 114 serializes some or all of the information from the violation store 113 and stores it on disk 102 as a file in a format such as XML (or any other file format) to enable outside applications to interface with violation store 113 and system 110 in general. Violation deserializer 115 receives the files from the outside applications and deserializes the data for violation store 113.

A violation visualizer 116 provides the design rule violations to the designer in an easily ascertainable manner. In one embodiment, violation visualizer 116 is an application which uses information in violation store to show violations to a user interactively via design layout 103. Any CAD layout could be used.

Violation visualizer 116 may use one or several browser windows. In one embodiment, violation visualizer 116 has four browsers: violation browser 117; a reason and trigger browser 118; a violation constraint hierarchy browser 119; and a documentation browser 120, all of which are displayed in the layout canvas 103.

Figure 3A:
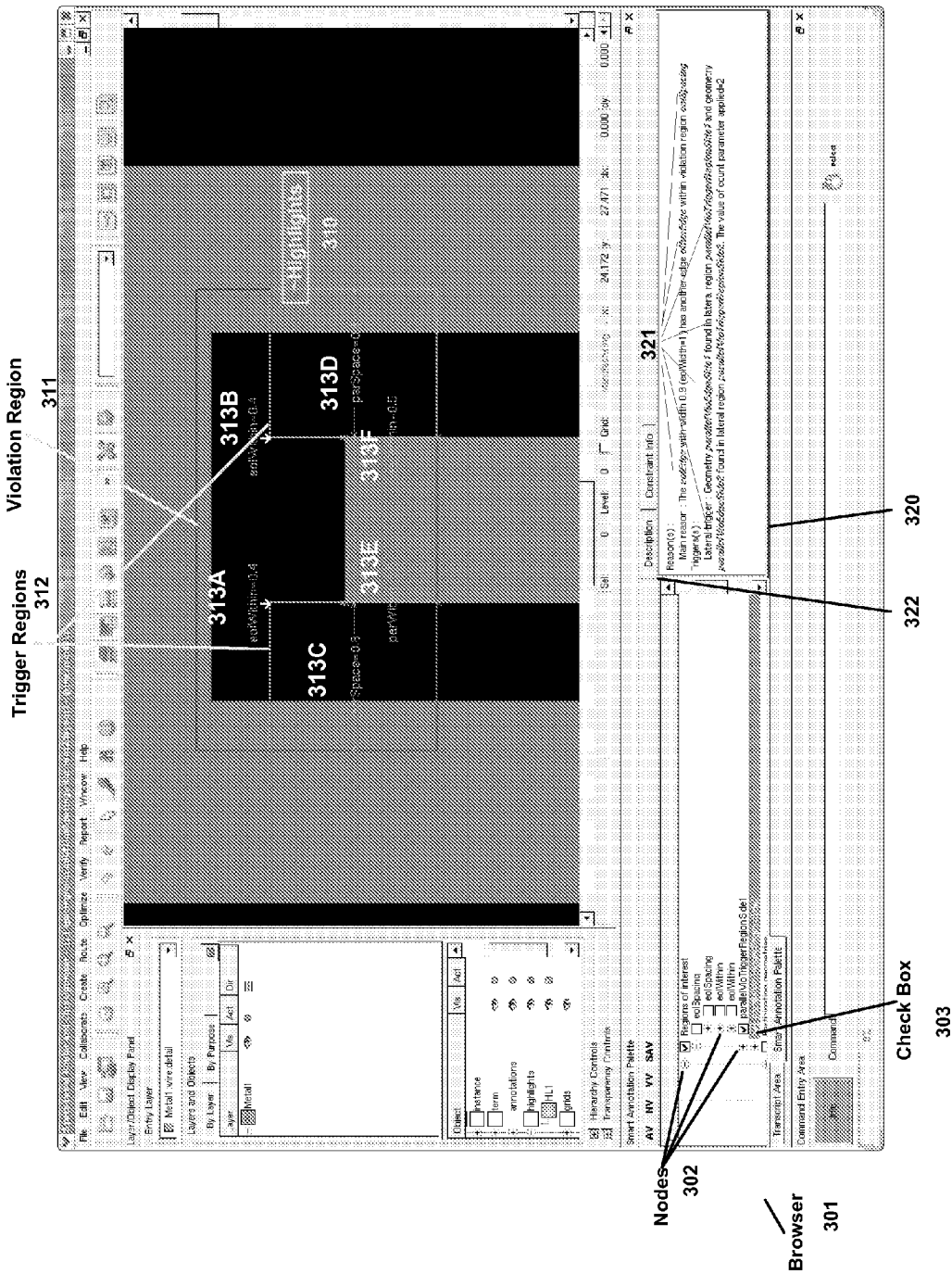
FIG. 3A depicts one type of Violation Visualizer display on a layout canvas in accordance with one aspect of the present invention.

Violation browser 117 displays a list of all current violations. One implementation of violation browser 117 is browser 301 in FIG. 3A. A magnified view of browser 301 is shown in FIG. 3B as 301B. Browser 301/301B shows all current violations as a list of hierarchically expandable nodes 302/302B. The list can be sorted and filtered by various properties. By way of non-limiting example, some of these properties may include, among other things, the constraint name, constraint category, and time of finding.

In one embodiment, Nodes 302/302B in Browser 301/301B can be expanded hierarchically to show sub-nodes representing constituent violation region, participating geometries, and trigger geometries. When the designer hovers a pointer over a node/sub-node or clicks on the node/sub-node, corresponding regions or shapes are highlighted on the canvas along with related textual, numeric, and dimensional information. Highlights 310 in FIG. 3A depict one way of what would be shown when a node is clicked on or hovered over.

Figure 4:
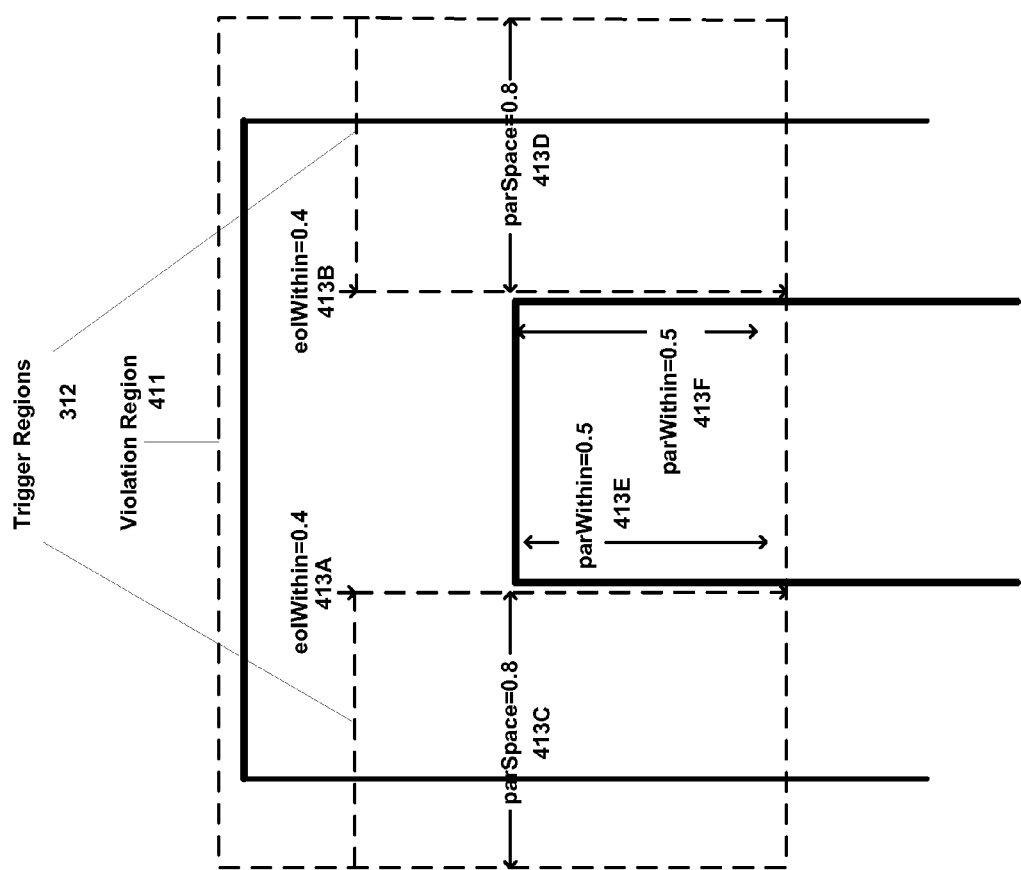
FIG. 4 is an expanded view of the Trigger Regions, Violation Regions and Textual Information of FIG. 3A.

FIG. 4 shows a magnification of the layout and displays the same highlights as dotted lines. Violation region 311 in FIG. 3A, which corresponds to violation region 411 (the outer larger dotted rectangle in FIG. 4), is an example of a highlighted violation region for the corresponding constraint rule. Trigger regions 312 in FIG. 3A, corresponding to trigger regions 412 (the small inner dotted rectangles) in FIG. 4, are regions that trigger the corresponding constraint rule. In one embodiment the violation region would be a different color than the trigger regions.

Textual Information 313A-F in FIG. 3B, corresponding to textual information 413A-F in FIG. 4, provides measurements and naming conventions with the corresponding constraint rule. The measurements can be displayed as values and lines representing the measurement values that are scaled to the relative sizes of the features in the layout. In one embodiment, it may be possible to turn the display of the highlights, measurements, and values on or off by checking or de-checking a respective checkbox 303/303B (FIG. 3/FIG. 3B).

Figure 5:
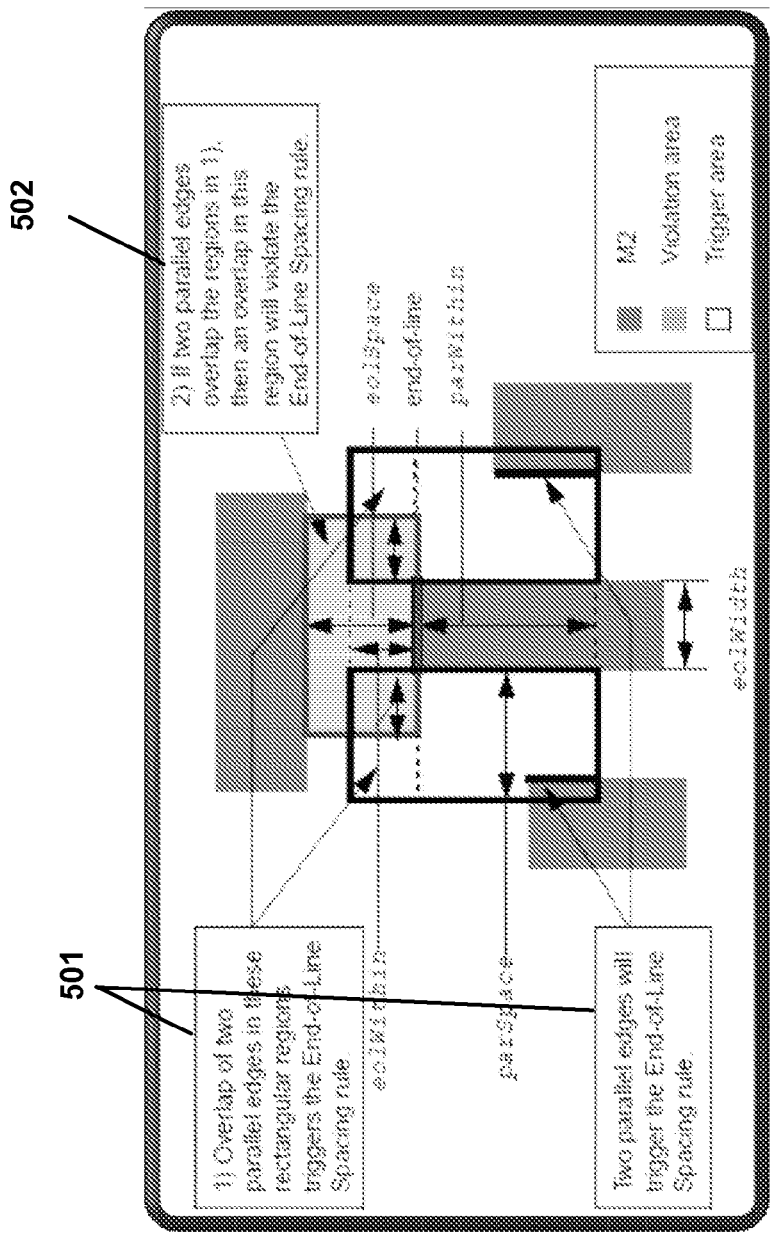
FIG. 5 depicts another type of the Violation Visualizer display on a layout canvas in accordance with one aspect of the present invention.

In one embodiment, along with the highlights, text bubbles with explanation of the rules may appear, as shown in FIG. 5. For example, text bubbles 501, 502 identify the regions to which they refer and explain the applicable attribute of a constraint rule and why it applies. In particular, text bubble 501 has two bubbles to explain the Distance parameter of an endOfLineSpacing rule that is being violated. The top bubble is identifying the trigger regions (the area in which the parameter applies). The bottom bubble identifies the edges that are causing the trigger to apply. Text bubble 502 identifies the area of the violation region and explains the violation rule. In another implementation, the text bubbles may highlight the corresponding violation regions, geometries, and/or trigger areas when a pointer is hovered over the text bubble. In another aspect, the text bubbles may be made "sticky" so that the text bubbles will remain visible for other designers to review. In still another implementation, the text bubbles may only show up by hovering a pointer over a particular region. In yet another implementation, the text bubbles may have hyperlinks embedded into the descriptions which link to formal specifications or definitions.

Reason and trigger browser 118 (FIG. 1) is another browser which shows a list of reasons and triggers for a violation. The reasons and triggers that the browser shows will also be determined by the violation node that is selected in violation browser 117. FIG. 3A shows one embodiment 320 of the reason and trigger browser; FIG. 3B shows a magnified version 320B of the same browser. Browser 320/320B provides a textual description of the violation including which constraint was violated and why. In one embodiment the descriptions include words in hypertext 321/321B as part of the text so that hovering a pointer over one of the hypertext words will highlight regions or shapes that correspond to that hypertext word.

Figure 6:
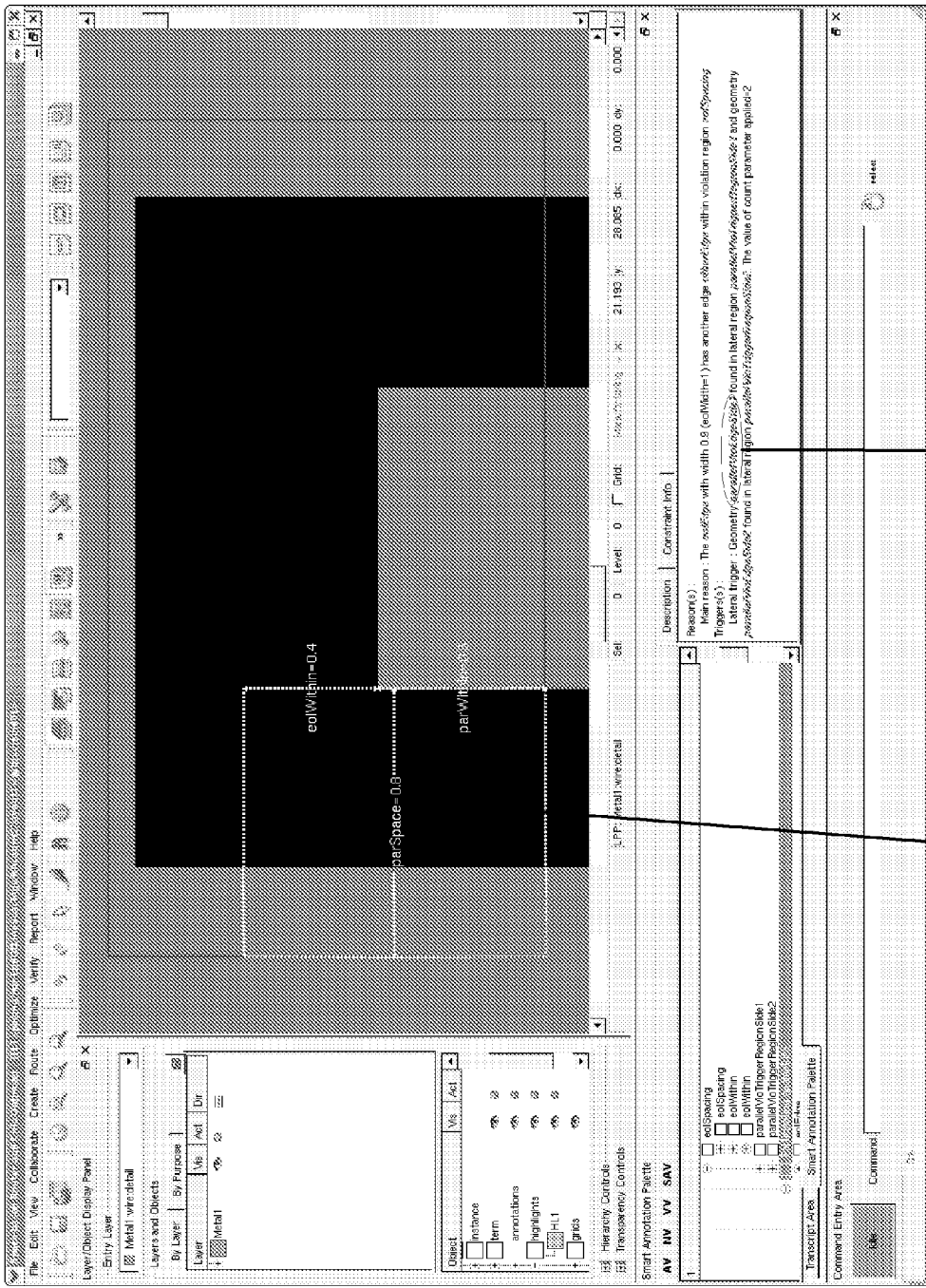
FIG. 6 depicts one implementation of a highlighting feature when a pointer is hovered over hypertext.

FIG. 6 depicts one implementation of the highlighting function in which highlight 600 (the dotted line) is implemented when a pointer hovers over hypertext 601. Here, highlight 600 outlines the parameter that triggered the constraint. Ordinarily skilled artisans, seeing the highlighted region, would be able to ascertain the geometry, within the highlighted region, that is causing a constraint rule to apply.

Additionally, it is possible to provide a hypertext link to the formal specifications of the constraints. In the violation vizualizer 116 of FIG. 1, formal specifications of the constraints may open a separate documentation browser 120. In one embodiment of reason and trigger browser 118, the textual description may be integrated with OpenAccess documentation to provide a brief description of constraints and a basic example of the constraint in the browser.

In one embodiment, violation constraint hierarchy browser 119 shows details of the constraint that was violated. The information that the violation constraint hierarchy browser 119 provides may include the name of the constraint, the value of the constraint, parameters and their values, and the criterion for the parameters and values.

Figure 7A:
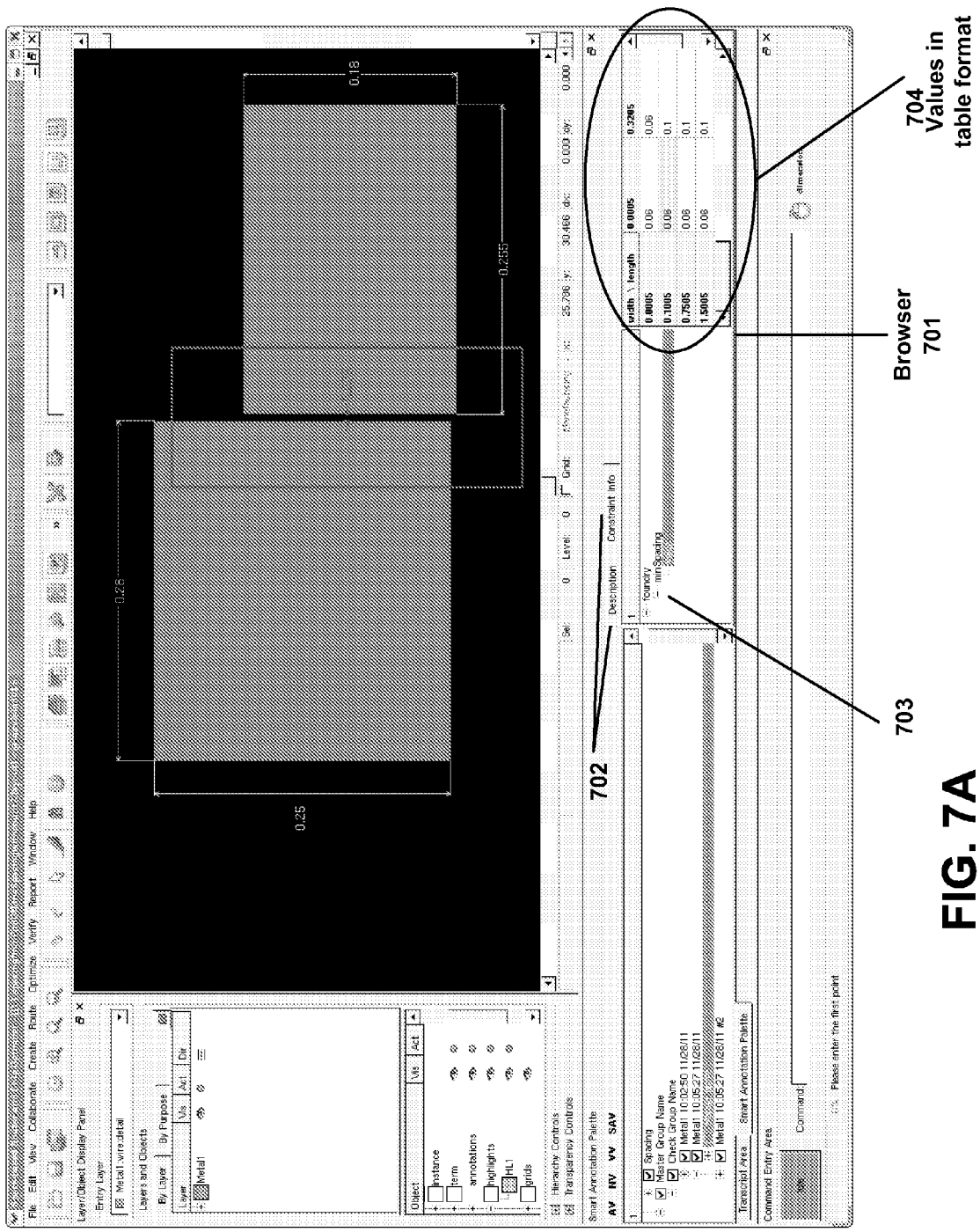
FIG. 7A depicts still another type of Violation Visualizer display on a layout canvas in accordance with one aspect of the present invention.
Figure 7B:
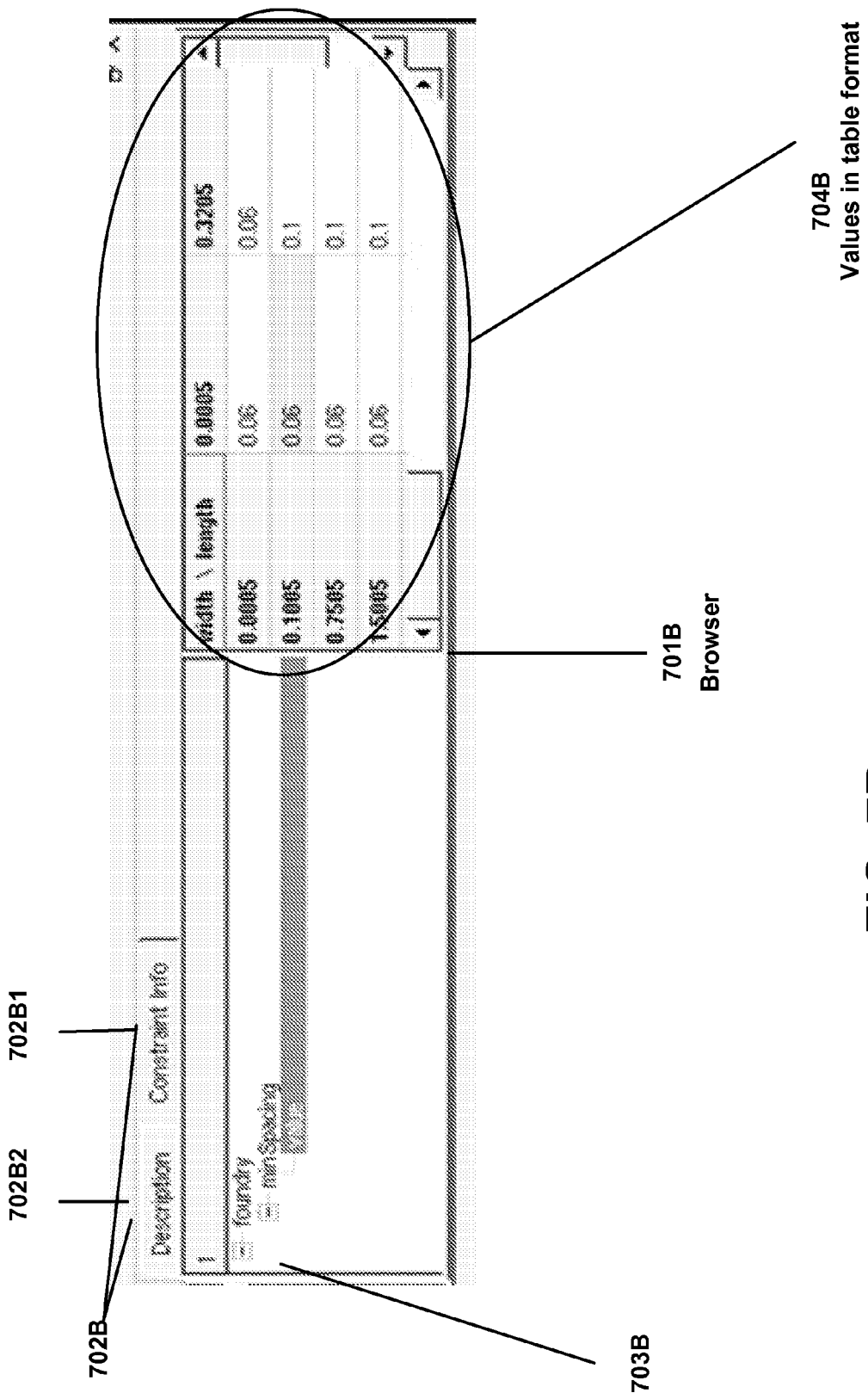
FIG. 7B is a magnification of a portion of the Violation Visualizer display shown in FIG. 7A.

FIG. 7A depicts browser 701 as one implementation of the violation constraint hierarchy browser 119. FIG. 7B shows a magnified portion 701B of browser 701. In one embodiment, browser 701/701B is in the same location as reason and trigger browser 118. Using tabs 702/702B, it is possible to switch between the two browsers. In one embodiment, Constraint Info tab 702B1 switches to the violation constraint hierarchy browser 119, while the Description tab 702B2 switches to reason and trigger browser 118.

Browser 701/701B allows exploration of the full hierarchy of a rule's attributes under which the constraint in question occurred through a hierarchy of nodes 703/703B. In one embodiment, Browser 701/701B will have the values of the constraint, values of the parameters, and the criterion of the parameters and values in a separate window from the hierarchy of nodes 703/703B. In this particular example the values of the constraint, values of the parameters, and the criterion of the parameters and values are represented as table 704/704B.

Figure 8:
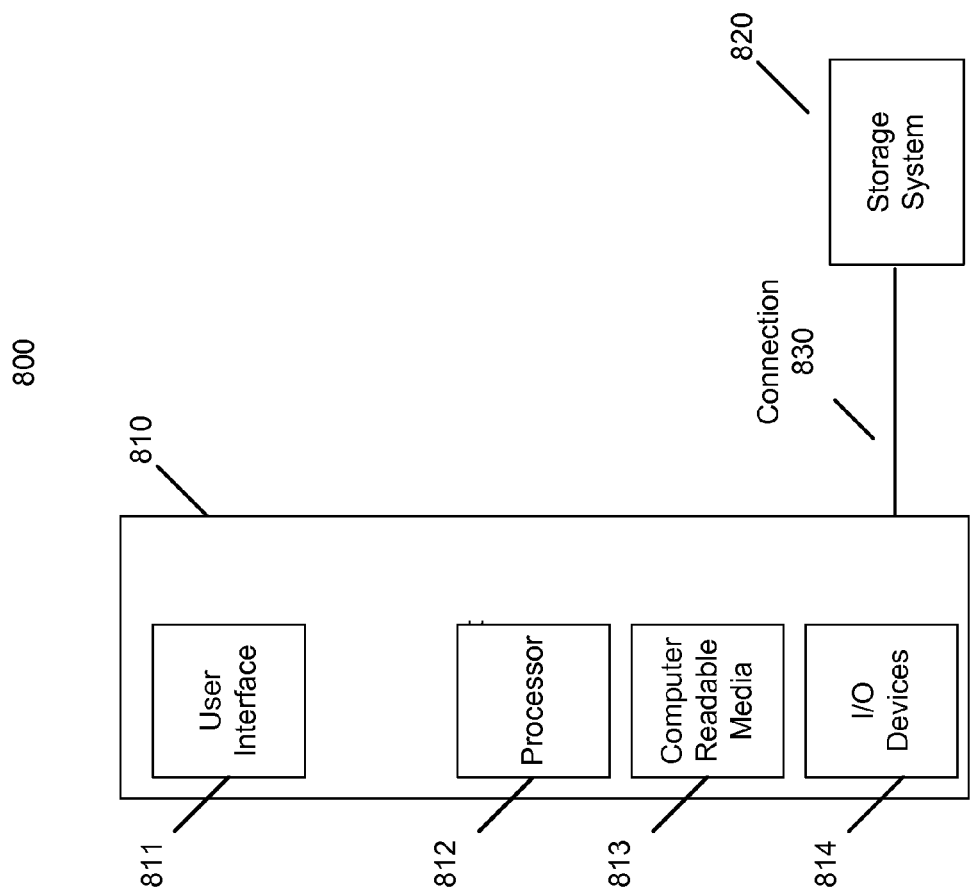
FIG. 8 is a block diagram illustrating components of an exemplary Design Rule Violation Reporting and Smart Visualization system according to an embodiment.

The above described Design Rule Violation Reporting and Smart Visualization system may be implemented through a standalone-client system, client-server environment, or a network environment. FIG. 8 is a block diagram illustrating components of an exemplary Design Rule Violation Reporting and Smart Visualization system 800 according to an embodiment. System 800 may comprise a computer system 810, a storage system 820, and a connection 830.

Computer system 810 may execute instructions stored on a computer readable medium that provides a user interface 811 which allows a user to access storage system 820 and Computer Readable Media 813. According to an aspect of an embodiment, the instructions may be part of a software program or executable file that operates EDA software. Computer system 810 may be any computing system, such as a personal computer, workstation, or other device employing one or more processors that can execute programming instructions stored on one or more computer readable media, and as noted, may be a client, a server, or part or all of a client-server environment. In one embodiment, Client 810 has one or more processors 812 that can execute programming instructions stored on one or more computer readable media 813 and/or storage system 820. Processor 812 may serve multiple functions such as execute instructions on a computer readable medium to process data. Computer readable media 813 and storage system 820 may include one or more compact disks, optical disks, hard drives, flash memory, magnetic strips, RAM, ROM, and other computer readable media. User interface 811 may be a GUI run in a user-controlled application window on a display, such as a monitor. A user may interact with user interface 811 through one or more I/O devices 814 such as a keyboard, a mouse, or a touch screen.

Storage system 820 may take any number of forms, including but not limited to a server with one or more storage devices attached to it, a storage area network, or one or a plurality of non-transitory computer readable media.

According to an aspect of an embodiment, only one computer system 810 is connected to storage system 820 through connection 830, which may be a simple direct wired or wireless connection, a system bus, a network connection, or the like, to provide computer system 810 with access to storage system 820. In one aspect, connection 830 may enable multiple computer system s to connect to storage system 820. The network connection may be a local area network, a wide area network, or any other type of network providing one or more computer system s 810 with access to storage system 820 and/or access to other computer system s on the network. The computer system s' degree of access may depend on system administrator settings, user settings, etc.

While particular embodiments of the present invention have been described, it is to be understood that various different modifications within the scope and spirit of the invention are possible. The invention is limited only by the scope of the appended claims.

What is claimed is:

1. A computer implemented method for reporting violations of design rules in a design layout of an integrated circuit, the method comprising:
   using a processor, collecting data identifying a first constraint within the layout and a first violation of the first constraint, wherein the collected data is in a format that is dependent on the first constraint;
   using a processor, converting the collected data into a first object having a data structure that is independent of the first constraint;
   storing the first object on a non-transitory computer readable medium; and
   displaying the first constraint and the first violation onto the layout using the first object.

2. The method of claim 1 wherein the converting comprises:
   converting the first constraint and the first violation into a second object having a data structure that is dependent on the first constraint; and
   converting the second object into the first object.

3. The method of claim 1 wherein the first constraint is one of a set of proprietary constraints that are specific to a particular semiconductor manufacturer.

4. The method of claim 1 wherein the collecting comprises collecting a plurality of constraints and a plurality of constraint violations, and wherein the displaying comprises:
   displaying a first browser that shows the plurality of constraint violations in the layout as a list of hierarchically expandable nodes.

5. The method of claim 4 wherein the plurality of constraints are part of a set of proprietary constraints that are specific to a particular semiconductor manufacturer.

6. The method of claim 1 wherein the displaying comprises:
   highlighting a region that corresponds to the first violation.

7. The method of claim 1 wherein the displaying comprises:
   highlighting, within the design layout, a region that triggered the first constraint.

8. A non-transitory computer readable medium storing instructions that, when executed by a processor, perform a method for reporting violations of design rules in a design layout of an integrated circuit, the method comprising:
   using a processor, collecting data identifying a first constraint within the layout and a first violation of the first constraint, wherein the collected data is in a format that is dependent on the first constraint;
   using a processor, converting the collected data into a first object having a data structure that is independent of the first constraint;
   storing the first object on a non-transitory computer readable medium; and
   displaying the first constraint and the first violation onto the layout using the first object.

9. The non-transitory computer readable medium of claim 8 wherein the converting comprises:
   converting the first constraint and the first violation into a second object having a data structure that is dependent on the first constraint; and
   converting the second object into the first object.

10. The non-transitory computer readable medium of claim 8 wherein the first constraint is one of a set of proprietary constraints that are specific to a particular semiconductor manufacturer.

11. The non-transitory computer readable medium of claim 8 wherein the collecting comprises collecting a plurality of constraints and a plurality of constraint violations, and wherein the displaying comprises:
    displaying a first browser that shows the plurality of constraint violations in the layout as a list of hierarchically expandable nodes.

12. The non-transitory computer readable medium of claim 11 wherein the plurality of constraints are part of a set of proprietary constraints that are specific to a particular semiconductor manufacturer.

13. The non-transitory computer readable medium of claim 8 wherein of displaying comprises:
    highlighting a region that corresponds to the first violation.

14. The non-transitory computer readable medium of claim 8 wherein the displaying comprises:
    highlighting a region that triggered the first design constraint.

15. A system for reporting violations of design rules in a design layout of an integrated circuit, the system comprising:
    a non-transitory computer-readable medium to store data identifying a first constraint within the layout and a first violation of the first constraint, wherein the data is in a format that is dependent on the first constraint; and
    a processor executing instructions to:
    collect the data;
    convert the collected data into a first object having a data structure that is independent of the first constraint;
    store the first object on the non-transitory computer readable medium; and
    display the first constraint and the first violation onto the layout using the first object.

16. The system of claim 15 wherein the processor further executes instructions to:
    convert the first constraint and the first violation into a second object having a data structure that is dependent on the first constraint; and
    convert the second object into the first object.

17. The system of claim 15 wherein the first constraint is one of a set of proprietary constraints that are specific to a particular semiconductor manufacturer.

18. The system of claim 15 wherein the processor executes instructions to:
    collect a plurality of constraints and a plurality of constraint violations; and
    display a first browser that shows the plurality of constraint violations in the layout as a list of hierarchically expandable nodes.

19. The system of claim 15 wherein the processor executes instructions to:
    highlight a region that corresponds to the first violation.

20. The system of claim 15 wherein the processor executes instructions to:
    highlight, within the design layout, a region that triggered the first constraint.

* * * * *